United States Patent [19]
Yamada et al.

[11] Patent Number: 5,608,226
[45] Date of Patent: Mar. 4, 1997

[54] ELECTRON-BEAM EXPOSURE METHOD AND SYSTEM

[75] Inventors: Akio Yamada; Hiroshi Yasuda, both of Kawasaki, Japan

[73] Assignee: Fujitsu Limited, Kawasaki, Japan

[21] Appl. No.: 404,718

[22] Filed: Mar. 15, 1995

[30] Foreign Application Priority Data

Mar. 18, 1994 [JP] Japan ..................................... 6-049499

[51] Int. Cl.$^6$ ............................ G01J 1/00; G01N 21/00; G01N 23/00
[52] U.S. Cl. ..................................... 250/491.1; 250/492.2
[58] Field of Search ............................ 250/491.1, 492.2, 250/398

[56] References Cited

U.S. PATENT DOCUMENTS

| | | | |
|---|---|---|---|
| 4,469,949 | 9/1984 | Mori et al. | 250/491.1 |
| 4,769,523 | 9/1988 | Tanimoto et al. | 219/121.6 |
| 4,785,187 | 11/1988 | Kariya et al. | 250/491.1 |
| 4,818,885 | 4/1989 | Davis et al. | 250/491.1 |
| 4,954,022 | 9/1990 | Underwood et al. | 408/1 R |
| 5,025,165 | 6/1991 | Chen et al. | 250/491.1 |
| 5,168,166 | 12/1992 | Hayakawa | 250/491.1 |

*Primary Examiner*—Bruce C. Anderson
*Attorney, Agent, or Firm*—Armstrong, Westerman, Hattori, McLeland & Naughton

[57] ABSTRACT

An electron-beam exposure system includes a stage on which a wafer is set, an exposure unit for exposing the wafer set on sid stage using an electron-beam, an optical detecting unit having an optical axis, and, a locating control unit for locating the stage at a target position based on a relative position of a deflection center line to the optical axis of the optical detecting means which target position is detected using a reference mark formed on the movable stage. In an electron-beam exposure method using the above electron-beam exposure system, the relative position is detected, and the target position of the movable stage is then calculated based on the relative position.

10 Claims, 7 Drawing Sheets

F I G. 1
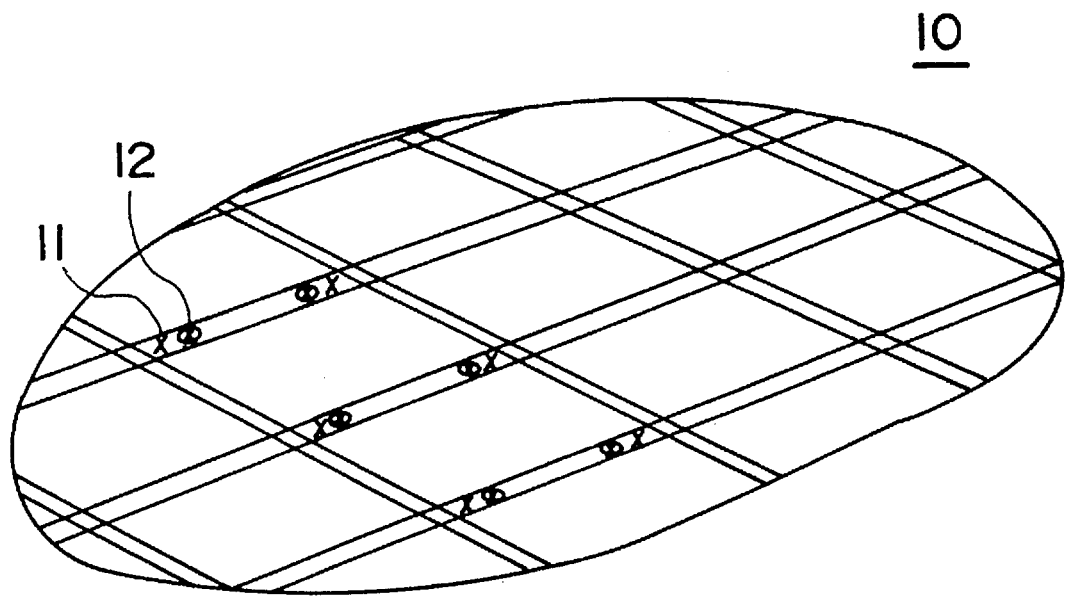

ELECTRON-BEAM EXPOSURE METHOD AND SYSTEM

BACKGROUND OF THE INVENTION (1) Field of the Invention

The present invention generally relates to an electron-beam exposure method and system, and more particularly to an electron-beam exposure method and system which can be easily used width an optical exposure system in a semiconductor device production process.

(2) Description of the Related Art

In general, in order to perform a exposure process on a plurality of layer in a wafer, the wafer processed by an electron-beam exposure system has marks which are readable by the electron-exposure system. The marks are formed at four corner portions of each of areas for IC chips on the wafer. In the electron-beam exposure system, the marks are used to decide a position at which the electron-beam exposure process is to be performed.

In the electron-beam exposure system, an electron-beam scans the marks so as to cross on the marks, and reflected electrons are then detected so that the marks are detected. On the other hand, in an optical exposure system, marks on a wafer are detected by measurement of interference of light and/or the intensity of reflected light.

Thus, to obtain the clear reflected electrons, the marks which are detectable in the electron-beam exposure system must be deeper than the marks which are detectable in the optical exposure system. That is, the marks which are detectable in the optical exposure system may not be used for the electron-beam exposure system.

Meanwhile, in recent years, due to increasing of the integration degree of an IC, exposure patterns are thinned. As a result, in a case where the exposure process is carried out in a plurality of layers of a wafer, it may be necessary to use the electron-beam exposure system for a layer instead of the optical exposure system used for other layers. Thus, there are cases where the system for performing the exposure process is switched from the optical exposure system to the electron-beam exposure system and vice versa, based on layers to be processed in the wafer.

In a case where the optical exposure process and the electron-beam exposure process are carried out for a single wafer, as shown in FIG. 1, a wafer 10 must be provided with two types of marks 11 and 12. The first type of mark 11 is detectable in the optical exposure system, and the second type of mark 12 is detectable in the electron-beam exposure system. However, the first type of mark 11 and the second type of mark 12 must be formed on the wafer 10 in different processes. Thus, the manufacturing cost of the wafer 10 is increased.

That is, the conventional electron-beam exposure o process and system are not easily used with the optical exposure process for a single wafer.

SUMMARY OF THE INVENTION

Accordingly, a general object of the present invention is to provide a novel and useful electron-beam exposure method and system in which the disadvantages of the aforementioned prior art are eliminated.

A specific object of the present invention is to provide an electron-beam exposure method which can be easily used with the optical exposure system for a single wafer.

The above objects of the present invention are achieved by an electron-beam exposure method using an electron-beam exposure system having a movable stage on which a wafer to be exposed is set, exposure means for exposing the wafer set on the movable stage using an electron-beam and reference direction setting means for setting a reference direction, the method comprising the steps of: (a) detecting a relative position of a direction in which the electron-beam used by the exposure means travels under a predetermined condition to the reference direction set by the reference direction setting means; (b) measuring a position of the movable stage which is located so that the reference direction is extended to the marks formed on the wafer; (c) calculating a expected position of the movable stage, based on the relative position obtained in the step (a) and the position of the movable stage obtained in the step (b), in a state where the direction in which the electron-beam used by the exposure means under the predetermined condition is extended to the mark formed on the wafer; and (d) calculating, based on the expected position obtained in the step (c),a target position at which the movable stage is to be located in an exposure process carried out by the exposure means, wherein the exposure means performing the exposure process using the electron-beam in a state where the movable stage is located at the target position.

Another object of the present invention is to provide an electron-beam exposure system which can be easily used with the optical exposure system for a single wafer The above object of the present invention is achieved by an electron-beam exposure system comprising: a stage on which a wafer is set; exposure means for exposing the wafer set on the stage using an electron-beam; reference direction setting means for setting a reference direction; and locating means for locating the stage at a target position on which the exposure means should performs an exposure process using the electron-beam, wherein the locating means comprises: detecting means for detecting a relative position of a direction in which the electron-beam used by the exposure means travels under a predetermined condition to the reference direction set by the reference direction setting means; measurement means for measuring a position of the movable stage which is located so that the reference direction is extended to the mark formed on the wafer; first calculation means for calculating a expected position of the movable stage based on the relative position obtained by the detecting means and the position of the movable stage obtained the measurement means, in a state where the direction in which the electron-beam used by the exposure means under the predetermined condition is extended to the mark formed on the wafer; and second calculation means for calculating, based on the expected position obtained by the first calculation means, the target position, wherein the exposure means performing the exposure process using the electron-beam in a state where the movable stage is located at the target position.

According to the present invention, a target position of the movable stage is calculated based on the relative position of the direction in which the electron-beam used by the exposure means travels under the predetermined condition to the reference direction set by the reference direction setting means. Thus, even if a wafer to be exposed has no mark detectable in the electron-beam exposure system the movable stage on which the wafer is set can be located at the target position.

BRIEF DESCRIPTION OF THE DRAWINGS

Other objects, features and advantages of the present invention will become apparent from the following description when read in conjunction with the accompanying drawings, in which:

FIG. 1 is a diagram illustrating a wafer provided with two types of marks;

DESCRIPTION OF THE PREFERRED EMBODIMENT

A description will now be given, with reference to FIG. 2, of the principle of an electron-beam exposure method and an electron-beam exposure system according to the present invention.

Figure 2:
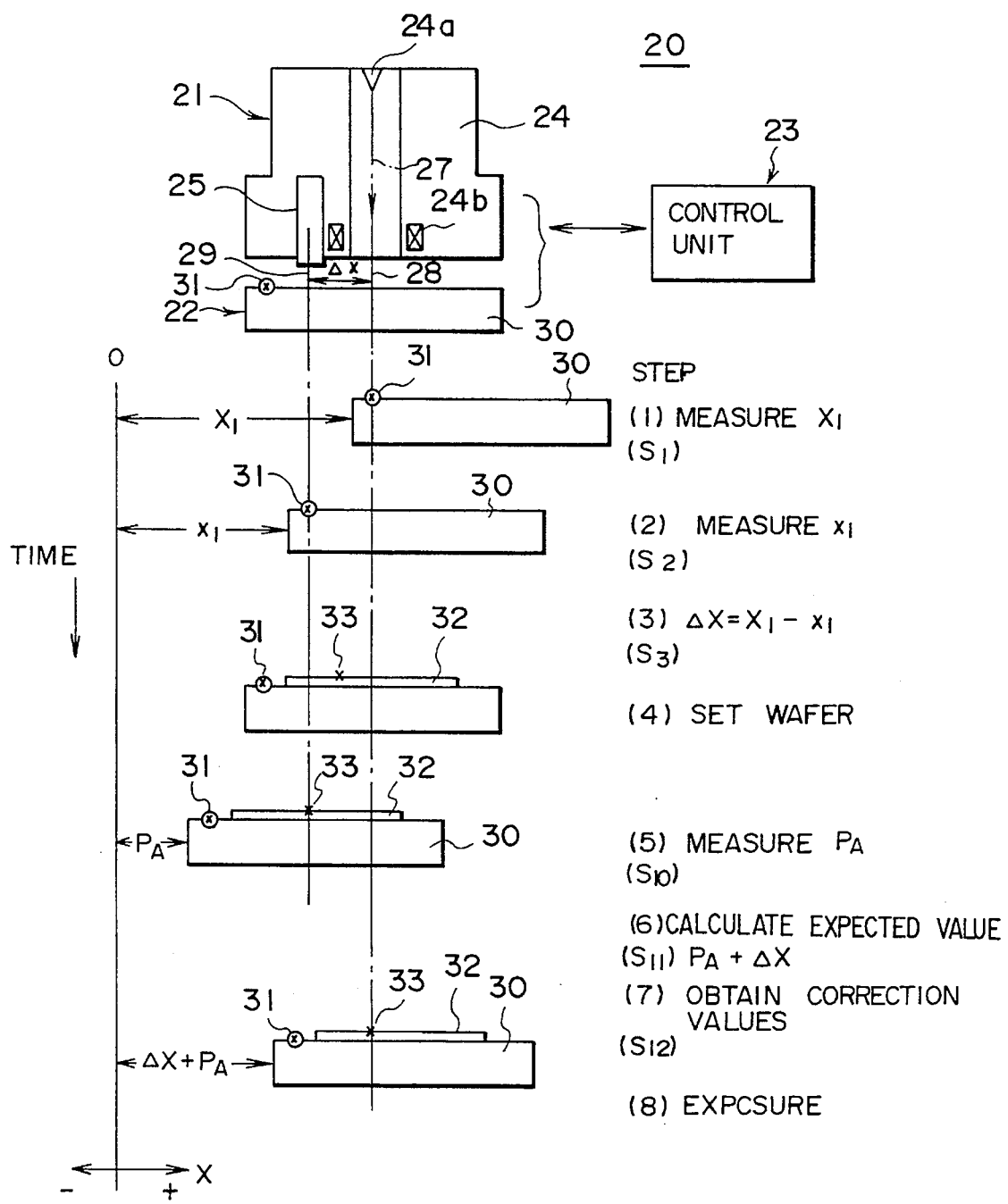
FIG. 2 is a diagram illustrating the principles of a system and a method according to the present invention.

Referring to FIG. 2, an electron-beam exposure system 20 has an electron-beam column unit 21, a stage unit 22 and a control unit 23. The stage unit 22 is made with a high accuracy.

The electron-beam column Unit 21 has a column body 24 and an optical microscope 25 mounted on the column body 24. The column body 24 is provided with an electron gun 24a and an electron-beam deflecting device 24b. The electron gun 24a emits an electron-beam 27, the electron-beam 27 passes through a deflecting center 28. The deflecting center 28 is a point at which the electron-beam is deflected by the electron-beam deflecting device 24b.

The optical microscope 25 is mounted on the surface of the column body 24 in a state where an optical axis 29 of the optical microscope 25 is perpendicular to the surface of the stage 30.

The stage unit 22 has a stage 30. A reference mark 31 is formed at a predetermined position on the surface of the stage 31 The mark 31 has a size and a shape to be detectable using the electron-beam. The reference mark 31 is also detected by using the optical microscope 25. In FIG. 2, the origin of the stage unit 22 is indicated by a symbol O.

The electron-beam column 24 and the stage unit 22 are controlled by the control unit 23.

In the electron-beam exposure unit 20, a relative position $\Delta X$ of a deflecting center line to the optical axis 29 of the optical microscope 25 (the reference direction) has been previously calculated in accordance with the following steps (1), (2) and (3). The deflecting center line is defined as a line which passes through the deflecting center 28 of the electron-beam and is perpendicular to the surface of the stage 30.

In step (1), the stage 30 is moved until the reference mark 31 reaches the deflecting center line. In a state where the reference mark 31 is on the deflecting center line, a position X1 of the stage 30 is measured.

In step (2), the stage 30 is moved until the reference mark 31 reaches the optical axis 29 of the optical microscope 25. In a state where the reference mark 31 is on the optical axis 29, a position x1 of the stage 30 is measured.

In step (3), a difference $\Delta X$ between the position X1 measured in step (1) and the position x1 measured in step (2) is calculated ($\Delta X=X1-x1$). The difference $\Delta X$ is a relative position of the deflecting center line to the optical axis 29 of the optical microscope 25.

The exposure process is then carried out as follows.

In step (4), a wafer 32 is set on the stage 30.

The wafer 32 is provided With only marks for the optical exposure system which wafer is a currently used one.

In step (5), the stage 30 is moved, and when the mark 33 reaches the optical axis 29, a position $P_A$ of the stage 30 is measured.

In step (6), a prediction value ($P_A+\Delta X$) is calculated using the position $P_A$ measured in step (5) and the relative position $\Delta X$ of the deflecting center line to the optical axis 29 calculated in step (3).

In step (7), correction values and other values used in the exposure process are Calculated.

In step (8), the stage 30 is located at the position ($P_A+\Delta X$). In this state, the electron-beam is deflected by the electron-beam deflecting device 24b based on the various values including the correction values calculated in step (7) so that the exposure process for the wafer 32 is carried out.

According to the above method, the relative position $\Delta X$ of the deflecting center line to the optical axis 29 is detected using the reference mark 31 provided on the stage 30, and the stage 30 is then located at a position using the relative position $\Delta X$ so that the mark 33 provided on the wafer 32 is on the deflecting center line. Thus, even if the mark 33 is not directly using the electron-beam, the electron-beam can be adjusted at the mark 33 formed on the wafer 32.

A description will now be given of an embodiment of the present invention.

Figure 3:
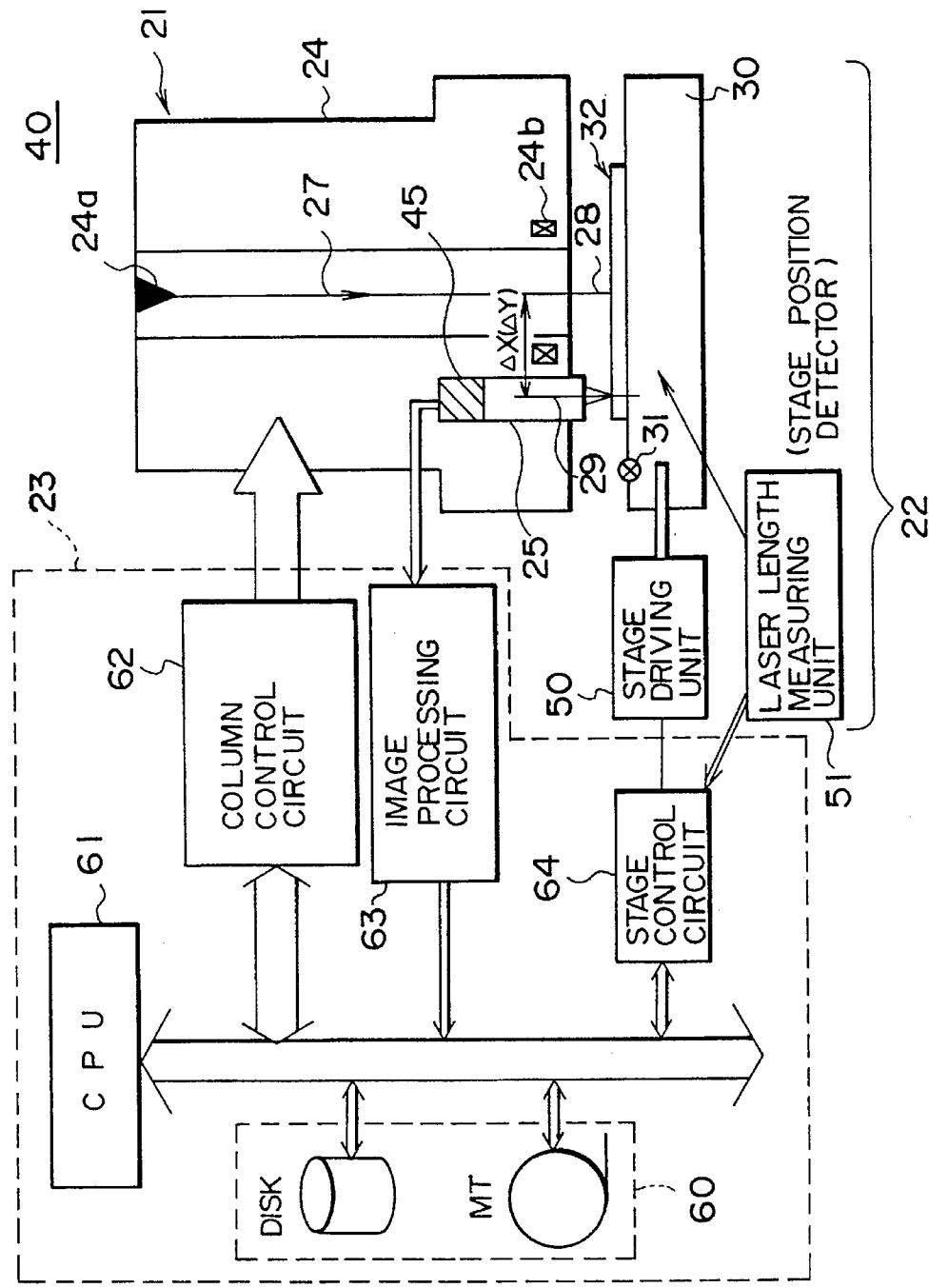
FIG. 3 is a block diagram illustrating an electron-beam exposure system according to an embodiment of the present invention.

FIG. 3 shows an electron-beam exposure system according to an embodiment of the present invention. In FIG. 3, those parts which are the same as those shown in FIG. 2 are given the same reference numbers.

Referring to FIG. 3, an electron-beam exposure system 40 has the electron-beam column unit 21, the stage unit 22 and the control unit 23 in the same manner as that described above. The stage unit 22 has an X-Y stage unit having a high positioning accuracy. The stage unit 22 has the stage 30, a stage driving unit 50 and a laser length measuring unit 51.

Figure 4:
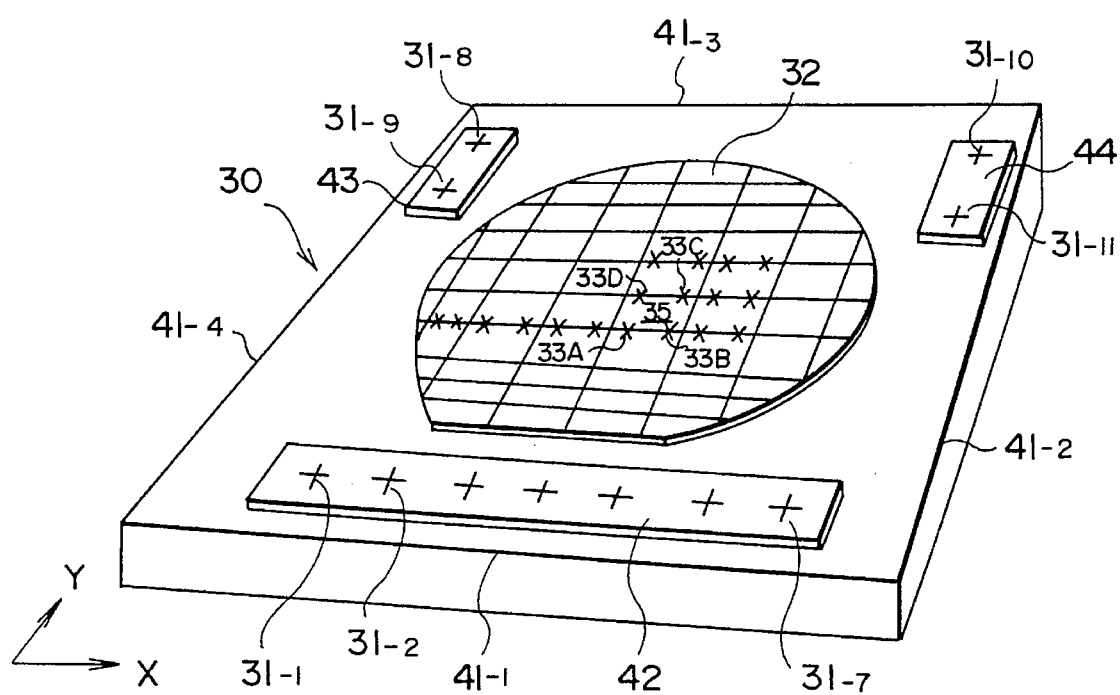
FIG. 4 is a diagram illustrating a stage unit in the electron-beam exposure system shown in FIG. 3.

The stage 30 is formed as shown in FIG. 4. Referring to FIG. 4, the stage 30 is squarely shaped and has four edges $41_{-1}$–$41_{-4}$. A plate 42 on which reference marks $31_{-1}$–$31_{-7}$ are formed is fixed on the surface of the stage 30 along the edge $41_{-1}$. A plate 43 on which reference marks $31_{-8}$ and $31_{-9}$ are formed is fixed on the surface of the stage 30 along the edge $41_{-4}$ in a corner portion between the edges $41_{-3}$ an $41_{-4}$. A plate 44 on which reference marks $31_{-10}$ and $31_{-1}$ are formed is fixed on the surface of the stage 30 along the edge $41_{-2}$ in a corner portion between the edges $41_{-2}$ and $41_{-3}$. That is, the reference marks $31_{-1}$–$31_{-11}$ are formed on the stage 30 (including a wafer holder) so as to surround an area on which the wafer 32 is to be set. The respective reference marks $31_{-1}$–$31_{-11}$ are provided with identifying numbers so as to be able to be identified.

The stage driving unit 50 drives the stage 30 in an X-direction and in a Y-direction. The laser length measuring unit 51 detects a position of the stage 30 on a coordinate system set in the stage unit 22.

The electron-beam column unit 21 has the column body 24, the electron gun 24a, the electron-beam deflecting device 24 and the optical microscope 25 all of which are arranged in the same manner as those shown in FIG. 2. The optical microscope 25 is mounted with a CCD camera 45 to which an optical image generated by the optical microscope 25 is supplied.

The control unit 23 has a data storage unit 60, a CPU (Central Processing Unit) 61, a column control circuit 62, an image processing circuit 63, a stage control circuit 64. The data storage unit 60 includes a disk unit and a magnetic tape unit, and stores exposure data used in the electron-beam exposure process. The CPU 61 controls the data storage unit 60 and the circuits. The column control circuit 62 operates in accordance with instructions from the CPU 61 so as to control the electron-beam deflection device 24b and other parts in the electron-beam column unit 21. The image processing circuit 63 receives image information from the CCD camera 45. The image processing circuit 63 then recognizes the reference marks formed on the stage 30 and the marks formed on the wafer 32 based on the received image information. The stage control circuit 64 receives measurement data from the laser length measuring unit 51. The stage control circuit 64 supplies, in accordance with instructions from the CPU 61, control signals based on the received measurement data to the stage driving unit 50. The stage driving unit 50 drives the Sage 30 based on the control signals.

In the electron-beam exposure system 40, a relative position of the deflecting center line to the optical axis 29 of the optical microscope 25 on a coordinate system set in the stage unit 22 has been previously calculated. The above coordinate system is referred to as a stage coordinate system. The relative position is peculiar to the electron-beam exposure system 40. The relative position has been previously stored in the control unit 23.

Figure 5:
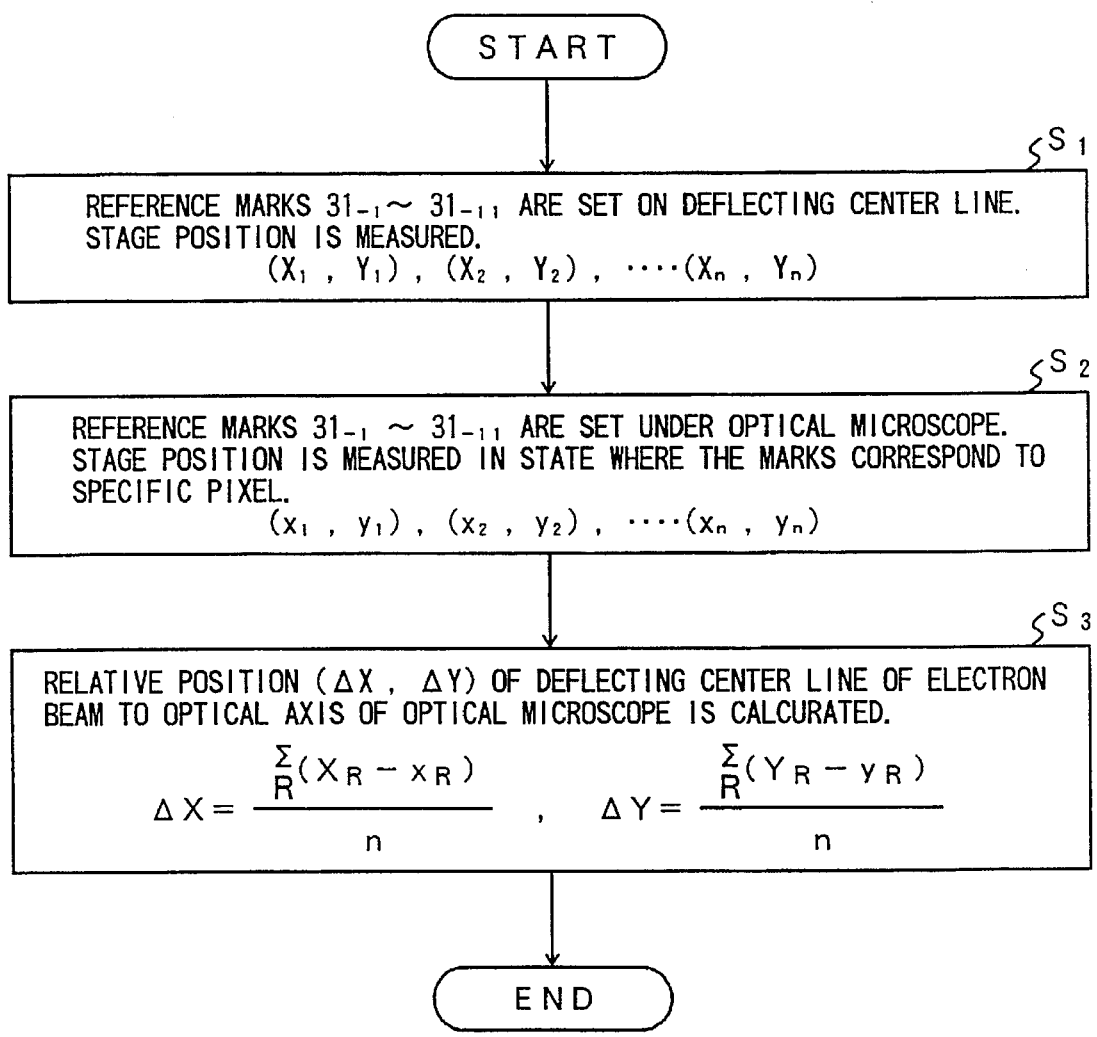
FIG. 5 is a flow chart illustrating a process for calculating a position of a deflecting center of an electron-beam with respect to a position of an optical axis (a reference direction) of an optical microscope.

The relative position is calculated in accordance with a procedure shown in FIG. 5.

Referring to FIG. 5, the procedure has three steps S1, S2 and S3. In step S1 (corresponding to the step (1) described above), the electron-beam 27 is emitted from the electron-beam gun 24a so as to travel on the deflecting center line. The stage 30 is driven by the stage driving unit 50 so that the electron-beam 27 hits each of the reference marks $31_{-1}$–$31_{-11}$. In the respective cases where the electron-beam 27 hits on the reference marks $31_{-1}$–$31_{-11}$, the laser length measuring unit 51 measures positions (X1, Y2), (X2, Y2), . . . , (X11, Y11) of the stage 30.

In step S2 (corresponding to the step (2) described above), the stage 30 is further driven by the stage driving unit 50. The image processing circuit 63 detects, based on the image information from the CCD camera 45, whether each of the reference marks $31_1$–$31_{-11}$ is on the optical axis 29 of the optical microscope 25. When an image correspond to a reference mark 31-i is projected onto a predetermined pixel of the CCD camera 45 by the optical microscope 25, it is determined that the reference mark 31-i is on the optical axis 29 of the optical microscope 25. In the respective cases where it is determined that the reference marks $31_{-1}$–$31_{11}$ are on the optical axis 29, the laser length measuring unit 51 measures positions (x1, y2), (x2, y2), . . . , (x11, y11) of the stage 30.

In step S3 (corresponding to the step (3) described above), the relative position ($\Delta X$, $\Delta Y$) of the deflecting center line to the optical axis 29 on the stage coordinate system is calculated in accordance with the following formulas.

$$\Delta X = \frac{\sum_{k=1}^{11}(X_k - x_k)}{11}$$

$$\Delta Y = \frac{\sum_{k=1}^{11}(Y_k - y_k)}{11}$$

In step S4, the relative position data ($\Delta X$, $\Delta Y$) is stored in the data storage unit 60. After the relative position data representing the relative position of the deflecting center line to the optical axis 29 of the microscope 25 is stored in the data storage unit 60, the exposure process is carried out in accordance with the following procedure.

(1) The wafer 32 is set at a center portion on the stage 30 and fixed thereon.

Figure 6:
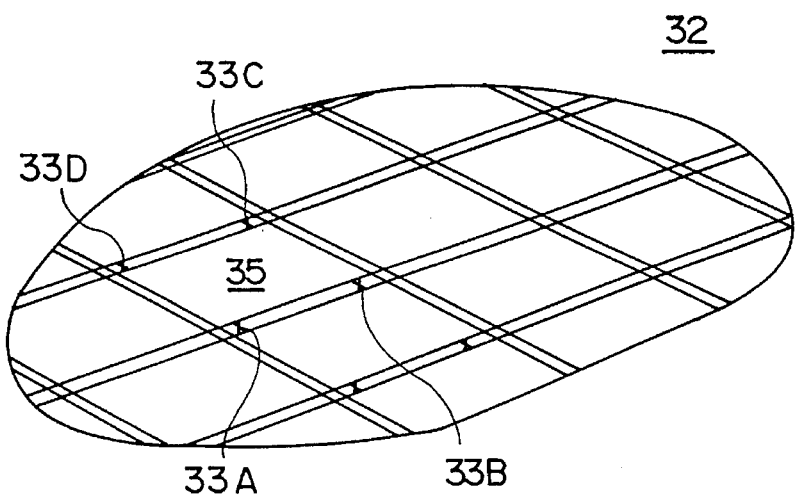
FIG. 6 is a diagram illustrating a wafer processed in the electron-beam exposure system.

The wafer 32 is provided, as shown in FIG. 6, with marks $33_A$–$33_D$ which are formed on scribing lines demarcating each chip area 35 to be exposed, at four corner portions of each chip area 35. The marks 33A–33D are only marks detectable in the optical exposure system.

(2) Measurement and calculation are carried out as will be described later so that positions of stage 30 are obtained. When the stage 30 are located at the positions obtained, the deflecting center line set in o the column unit 21 are on positions, in the chip area 35, depending on positions of the respective marks 33A–33D.

(3) The deflecting device 24b are driven in accordance with the control signals from the column control circuit 62 so that the electron-beam emitted from the electron-beam gun 42a is deflected. As a result, the electron-beam exposure process is carried out on the chip area 35.

Figure 7:
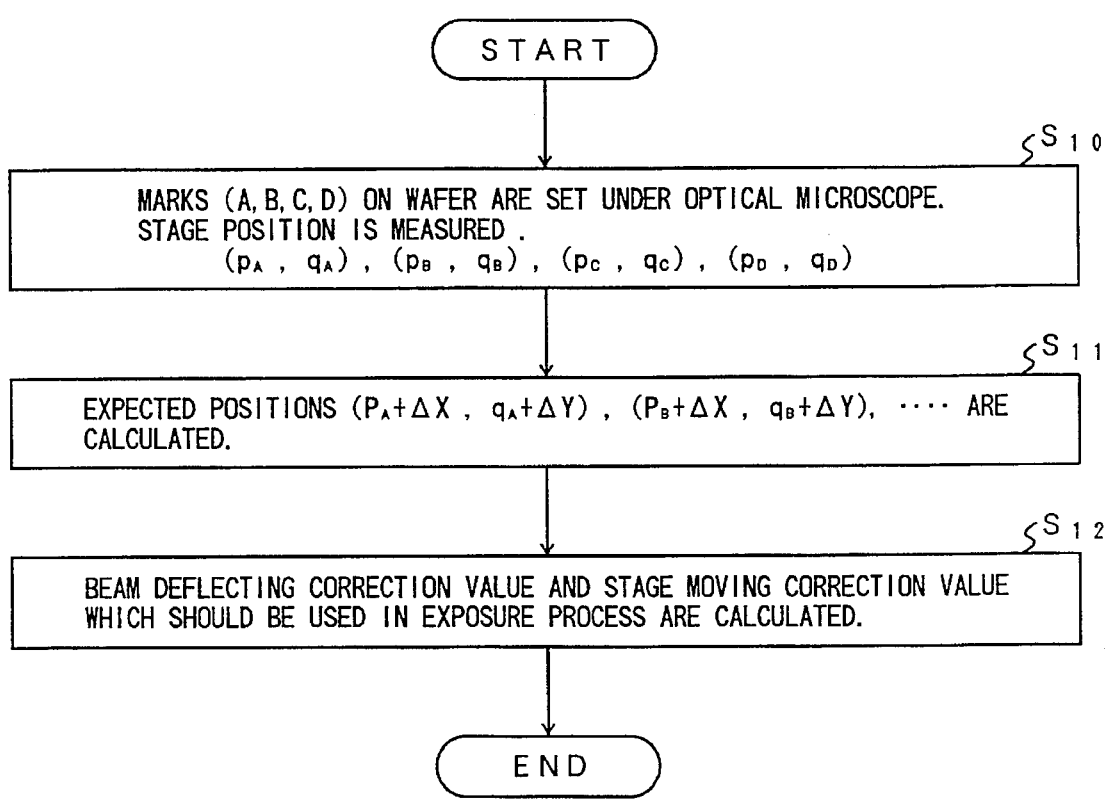
FIG. 7 is a flow chart illustrating a process for calculating a target position to which the stage unit mounted with a wafer is located.

The operation in the above item (2) is performed in accordance with a procedure shown in FIG. 7. Referring to FIG. 7, the procedure has steps S10, S11 and S12.

In step S11 (corresponding to step (5) described with reference to FIG. 2), the stage 30 is moved by the stage driving unit 50 until it is detected based on the information from the image processing circuit 63 that the optical axis 29 of the microscope 25 is on each of the marks 33A–33D. Every time it is detected that the optical axis 29 is on one the mark is 33A–33D, the laser length measuring unit 51 measures a position of the stage 30. Measured positions of the stage 30 corresponding to the respective marks 33A–33D are represented by coordinates ($p_A$, $q_A$), ($p_B$, $q_B$), ($p_C$, $q_C$) and ($p_D$, $q_D$) on the stage coordinates system.

In step S11 (corresponding to the step (6) described with reference to FIG. 2), positions represented by the following coordinates are calculated.

($p_A+\Delta X$, $q_A+\Delta Y$)
($p_B+\Delta X$, $q_B+\Delta Y$)
($p_C+\Delta X$, $q_C+\Delta Y$)
($p_D+\Delta X$, $q_D+\Delta Y$)

These positions are position at which the stage 30 is located in a case where the deflecting center line set in the electron-beam column unit 21 will be on the respective marks 33A–3D. Theses positions are referred to as stage expected positions.

In step S12 (corresponding to the step (7) described with reference to FIG. 2), target positions at which the stage 30 is to be located in the electron-beam exposure process are calculated based on the stage expected positions calculated in the step S11. In addition, to carry out the electron-beam exposure process at predetermined positions on the chip area 35 in a state where the stage 30 is located at the respective target positions, deflecting correction data which is supplied to the deflecting device 24b is calculated based on the stage expected positions obtained in the step S11.

Due to use of the deflecting correction data, even if the wafer 32 is slightly distorted, a position at which the electron-beam hits on the chip area 35 is corrected. As a result, an exposure pattern is formed at correct positions.

After the deflecting correction data is calculated, while the stage 30 is being moved so as to be located at the respective target positions, the electron-beam exposure process, based on the control signals including various correction data obtained in step S12, is carried out on the chip area 35 surrounded by the marks 33A–33D.

A description will now be given, with reference to FIG. 8, of a modification of the electron-beam exposure system.

Figure 8:
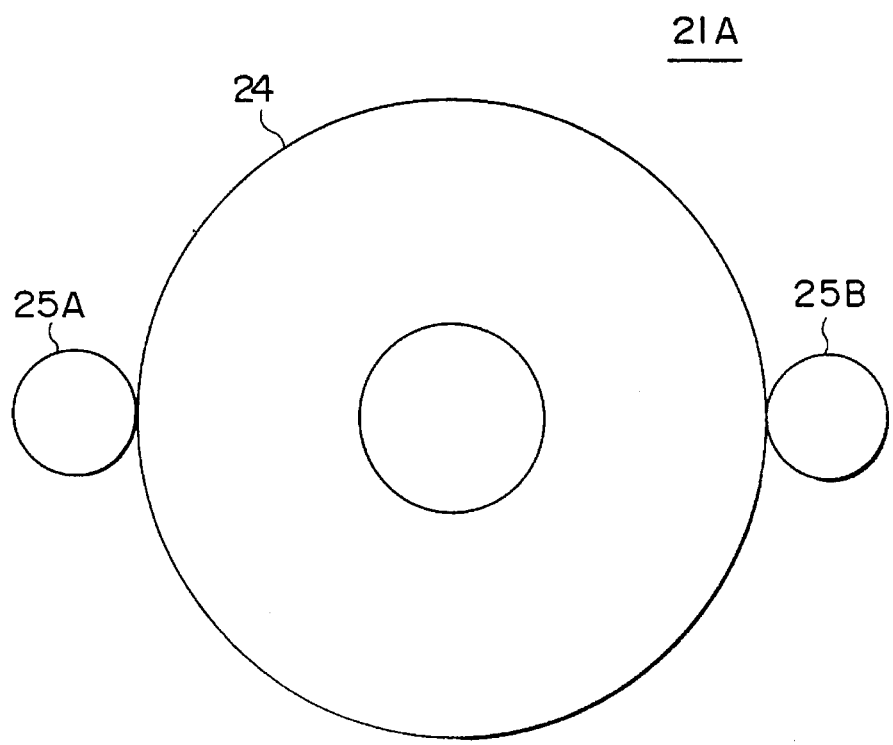
FIG. 8 is a plane view showing a modification of an electron-beam column unit provided in the electron-beam exposure system.

In the electron-beam exposure system, the electron-beam column unit 21 may be formed as shown in FIG. 8. FIG. 8 shows a bottom view of the electron-beam column unit 21A.

Referring to FIG. 8, the electron-beam column unit 21A is provided with two optical microscopes 25A and 25B which are mounted on surface thereof so as to be opposite to each other on a line corresponding to a diameter of the column body 24.

According to the electron beam exposure system having the above electron-beam column unit 21A, the optical microscope 25A is used for a right half area of the wafer 32 and the stage 30 and the optical microscope 25B is used for a left half area of the wafer 32 and the stage 30. As a result, a region in which the stage 30 is moved in measurement of various positions can be narrowed In addition, a unit for detecting a position of the surface of the wafer 32 in a Vertical direction may be added to the optical microscopes 25A and 25B. In this case, a fine focusing control of the electron-beam can be performed based on information from the above unit.

The present invention is not limited to the aforementioned embodiments, and variations and modifications may be made without departing from the scope of the claimed invention.

What is claimed is:

1. An electron-beam exposure method using an electron-beam exposure system having a movable stage on which a wafer to be exposed is set, exposure means for exposing the wafer set on said movable stage using an electron-beam, and a plurality of optical detecting units each of which detects a reference mark on one of areas of the wafer, and wherein each of said plurality of optical detecting units has an optical axis which is parallel to an axis of the electron beam, and wherein a fixed distance between said optical axis and said axis of the electron beam has been determined and is stored by a control means, wherein the control means controls said movable stage to move said wafer to a target position for exposure of said wafer by said electron-beam exposure system, said method comprising the steps of:

(a) selecting one of said optical detecting units;

(b) moving said movable stage while using an optical detecting unit selected in step (a) to detect the reference mark;

(c) measuring a position of said movable stage as an origin where said reference mark has been detected by said optical detecting unit;

(d) calculating an expected position of said movable stage using said position of said movable stage at step (c) and adding said fixed distance to said position which has been stored by said control means; and (e) calculating using said control means, based on the expected position of said reference mark obtained in said step (d), a required distance in which said movable stage is to be moved so that said wafer reaches said target position at which said movable stage is to be located such that said wafer is in said target position during an exposure process carried out by said exposure means, wherein every time an optical detecting unit is selected in step (a), steps (b), (c), (d), and (e) are successively performed.

2. The method as claimed in claim 1, wherein said movable stage has a reference mark formed thereon, the reference mark being optically detectable and being detectable using the electron-beam, wherein said step (b) comprises a steps of:

(b-1) measuring a first position of said movable stage in a state where the optical axis of said optical detecting means is set on the reference mark based on a detecting result obtained when said optical detecting means detects the reference mark;

(b-2) measuring a second position of said movable stage in a state where the electron-beam used by the exposure means under the predetermined condition travels to the reference mark; and (b-3) calculating, as the relative position, a difference between the first position and second position.

3. The method as claimed in claimed 2, wherein said step (c) has a step of:

measuring the position of said movable stage which is located so that the optical axis is set on the mark formed on said wafer based on a detecting result obtained when said optical detecting unit detects the mark.

4. The method as claimed in claim 1, wherein said step (d) has a step of:

(d-1) adding the relative position obtained by said step (b) to the position of said movable stage obtained in step (c), a result obtained in said step (d-1) corresponding to the expected position.

5. The method as claimed in claim 1, wherein the direction in which the electron-beam used by said exposure means is a direction in which the electron-beam travels through a deflecting center, the deflecting center being a point at which the electron-beam is to be deflected in the exposure process.

6. An electron-beam exposure system comprising:

a movable stage on which a wafer is set;

exposure means for exposing the wafer set on said movable stage using an electron-beam;

reference direction setting means for setting a reference direction;

control means for determining and storing a fixed distance between said optical axis and said axis of the electron beam, wherein the control means controls said movable stage to move said wafer to a target position for exposure of said wafer by said electron-beam exposure system; and locating means for locating said stage at a target position on which said exposure means should perform an exposure process using the electron-beam, wherein said locating means comprises:

detecting means including a plurality of optical detecting units each of which detects a reference mark on one of areas of the wafer, and wherein each of said plurality of optical detecting units has an optical axis which is parallel to an axis of the electron beam;

said detecting means detecting a relative position of a direction in which the electron-beam used by said exposure means travels under a predetermined condition to the reference direction set by said reference direction setting means;

measurement means for measuring a position of said movable stage while using a selected one of said plurality of optical detecting units to detect the reference mark, which is located so that the reference direction is extended to the mark formed on said wafer;

first calculation means for calculating an expected position of said movable stage, based on the relative position obtained by said detecting means and the position of said movable stage obtained by said measurement means, in a state where the direction in which the electron-beam used by said exposure means under the predetermined condition is extended to the mark formed on said wafer; and second calculation means for calculating, based on the expected position obtained by said first calculation means, the target position, wherein said exposure means performs the exposure process using the electron-beam in a state where said movable stage is located at the target position.

7. The system as claimed in claim 6, wherein said stage has a reference mark formed thereon, the reference mark being optically detectable and being detectable using the electron-beam, wherein said detecting means comprises:

first measurement means for measuring a first position of said stage in a state where the optical axis of said optical detecting means is set on the reference mark based on a detecting result obtained when said optical detecting means detects the reference mark;

second measurement means for measuring a second position of said stage in a state where the electron-beam used by the exposure means under the predetermined condition travels to the reference mark; and means for calculating, as the relative position, a difference between the first position and second position.

8. The system as claimed in claim 7, wherein said measurement means has:

means for measuring the position of said movable stage which is located so that the optical axis is set on the mark formed on said wafer based on a detecting result obtained when said optical detecting means detects the mark.

9. The system as claimed in claim 6, wherein said first calculation means has:

addition means for adding the relative position obtained by said detecting means to the position of said movable stage obtained by said measurement means, a result obtained said addition means corresponding to the expected position.

10. The system as claimed in claim 6, wherein the direction in which the electron-beam used by said exposure means is a direction in which the electron-beam travels through a deflecting center, the deflecting center being a point at which the electron-beam is to be deflected in the exposure process.

* * * * *